US010424545B2

(12) United States Patent
Lin

(10) Patent No.: US 10,424,545 B2
(45) Date of Patent: Sep. 24, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventor: JR-Wei Lin, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 11 days.

(21) Appl. No.: 15/786,299

(22) Filed: Oct. 17, 2017

(65) Prior Publication Data

US 2019/0115305 A1 Apr. 18, 2019

(51) Int. Cl.
H01L 23/552 (2006.01)
H01L 25/065 (2006.01)
H01L 23/538 (2006.01)
H01L 23/31 (2006.01)
H01L 23/00 (2006.01)
H01L 21/48 (2006.01)

(52) U.S. Cl.
CPC ........ H01L 23/552 (2013.01); H01L 21/4846 (2013.01); H01L 23/3121 (2013.01); H01L 23/5386 (2013.01); H01L 24/16 (2013.01); H01L 25/0655 (2013.01); *H01L 2224/16227* (2013.01); *H01L 2924/19105* (2013.01); *H01L 2924/3025* (2013.01)

(58) Field of Classification Search
None
See application file for complete search history.

(56) References Cited

U.S. PATENT DOCUMENTS

| 8,247,889 | B2 | 8/2012 | Liao et al. | |
|---|---|---|---|---|
| 9,070,793 | B2 | 6/2015 | Liao et al. | |
| 2006/0221591 | A1* | 10/2006 | Kong | H05K 1/0218 361/818 |
| 2007/0176281 | A1* | 8/2007 | Kim | H01L 23/3128 257/700 |
| 2007/0246825 | A1* | 10/2007 | Oh | H01L 23/3121 257/728 |
| 2009/0086461 | A1* | 4/2009 | Lee | H01L 23/3121 361/816 |
| 2010/0200965 | A1* | 8/2010 | Liao | H01L 23/552 257/659 |

* cited by examiner

Primary Examiner — Herve-Louis Y Assouman
(74) Attorney, Agent, or Firm — Foley & Lardner LLP; Cliff Z. Liu

(57) ABSTRACT

The present disclosure provides for a semiconductor package device and a method for manufacturing the same. The semiconductor package device includes a substrate, a shielding wall and a package body. The substrate has a top surface. The shielding wall is disposed on the top surface. The shielding wall has a conductive main body and a plurality of protruding portions extending from the conductive main body. The package body encapsulates the shielding wall.

37 Claims, 18 Drawing Sheets

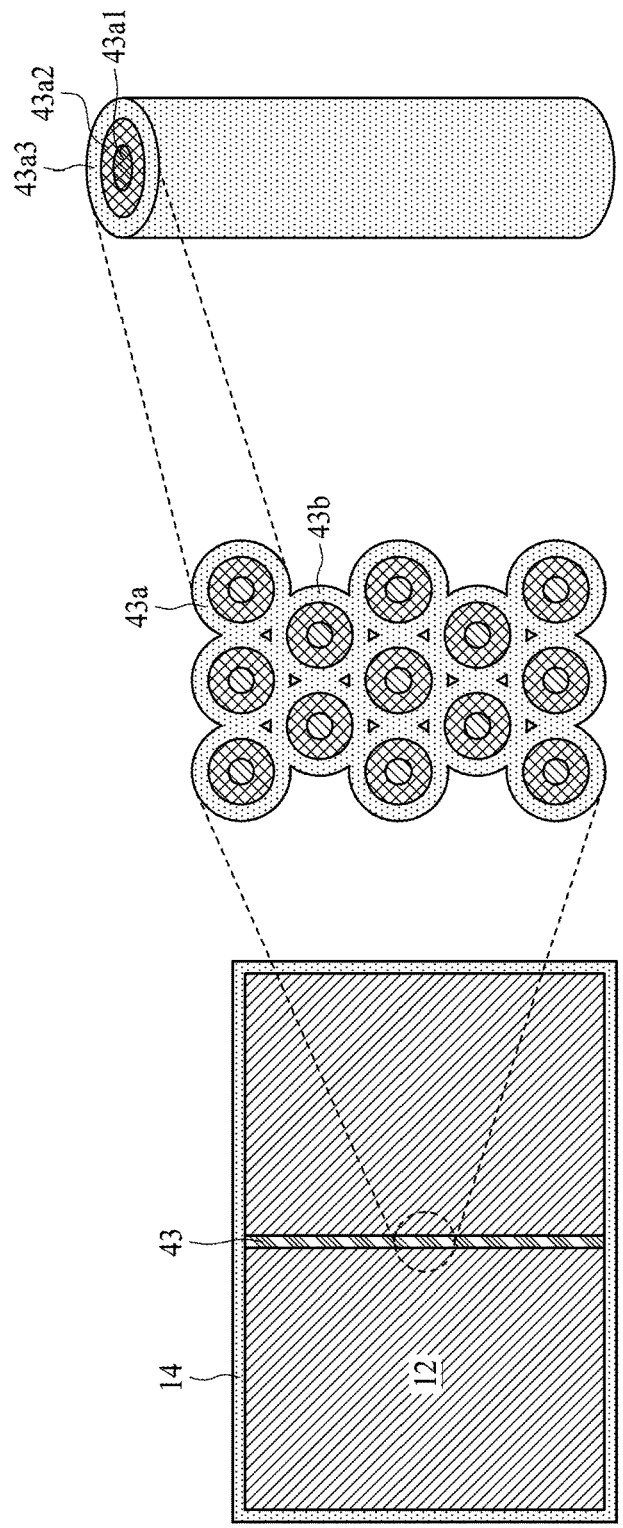

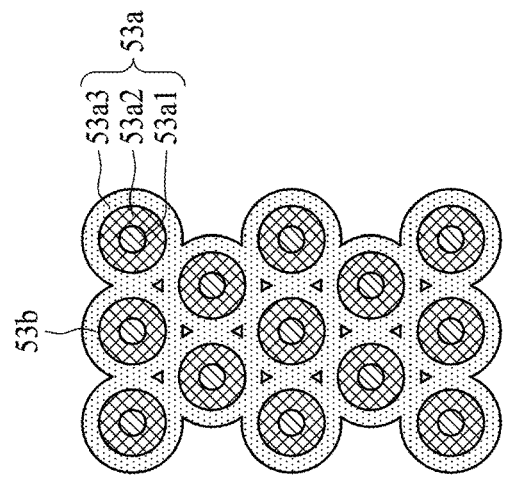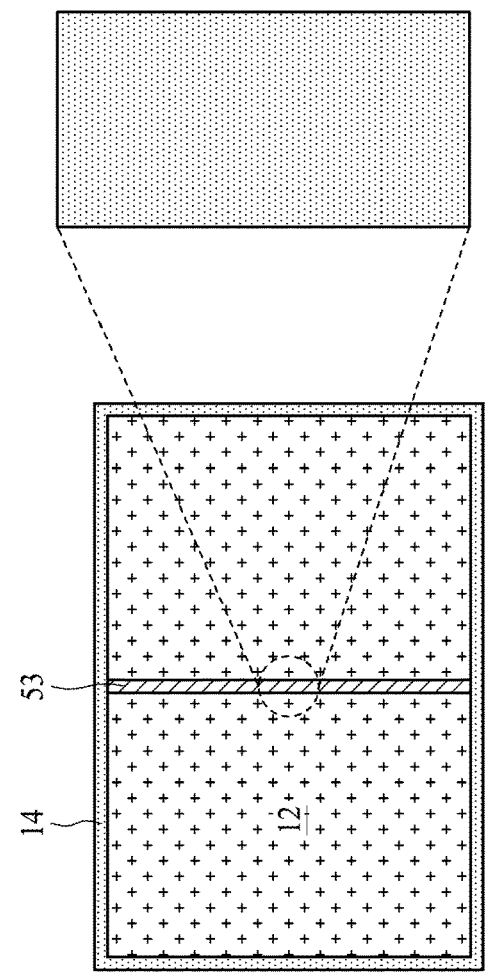
FIG. 5A  FIG. 5B  FIG. 5C

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and to a semiconductor package device including a shielding element and a manufacturing method thereof.

2. Description of the Related Art

Semiconductor devices have become progressively more complex, driven at least in part by the demand for enhanced processing speeds and smaller sizes. Enhanced processing speeds tend to involve higher clock speeds, which can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of the neighboring semiconductor device. This phenomenon is sometimes referred to as electromagnetic interference (EMI). Smaller sized semiconductor devices can exacerbate EMI by providing a higher density of semiconductor devices within an overall electronic system, and, thus, a higher level of undesired electromagnetic emissions at neighboring semiconductor devices. One way to reduce EMI is to separate two electronic components by using a compartment shielding. However, the compartment shielding may be made of silver or copper, which would increase the cost for manufacturing the semiconductor package device.

SUMMARY

In one or more embodiments of the present disclosure, a semiconductor package device includes a substrate, a shielding wall and a package body. The substrate has a top surface. The shielding wall is disposed on the top surface. The shielding wall has a conductive main body and a plurality of protruding portions extending from the conductive main body. The package body encapsulates the shielding wall.

In one or more embodiments of the present disclosure, a semiconductor package device includes a substrate, a shielding wall and a package body. The substrate has an upper surface. The shielding wall is disposed on the upper surface of the substrate. The shielding wall has an upper surface and defines a plurality of through holes to expose the upper surface of the substrate. The package body encapsulates the shielding wall.

In one or more embodiments of the present disclosure, a semiconductor package device includes a substrate, a package body and a conductive main body. The substrate has a top surface. The package body is disposed on the top surface of the substrate. The conductive main body is disposed on the top surface of the substrate and encapsulated by the package body. The conductive main body includes a first set of conductive columns. A projected area of one conductive column of the first set of conductive columns on the top surface of the substrate is greater than an area of the one conductive column that is exposed from the package body.

In one or more embodiments of the present disclosure, a semiconductor package device includes a substrate, a shielding wall and a package body. The shielding wall is disposed on the substrate. The shielding wall includes a plurality of conductive members disposed adjacent to each other. One of the conductive members includes a core, an inner layer covering the core and an outer layer covering the inner layer. The package body is disposed on the substrate and covers the shielding wall. The package body includes a first portion and a second portion separated from the first portion by the shielding wall.

BRIEF DESCRIPTION OF THE DRAWINGS

FIG. 4A illustrates a top view of a semiconductor package device in accordance with some embodiments of the present disclosure.

FIG. 4B illustrates an enlarged view of a portion of a shielding wall in accordance with some embodiments of the present disclosure.

FIG. 4C illustrates a perspective view of a portion of a shielding wall in accordance with some embodiments of the present disclosure.

FIG. 5A illustrates a top view of a semiconductor package device in accordance with some embodiments of the present disclosure.

FIG. 5B illustrates an enlarged view of a portion of a shielding wall in accordance with some embodiments of the present disclosure.

FIG. 5C illustrates a perspective view of a portion of a shielding wall in accordance with some embodiments of the present disclosure.

Figure 1A:
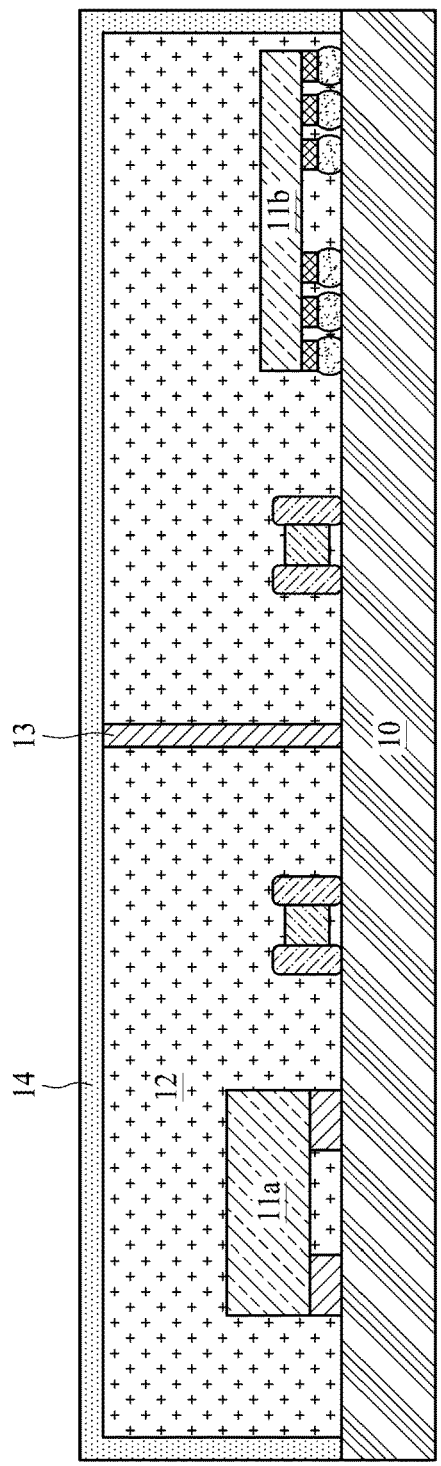
FIG. 1A illustrates a cross-sectional view of a semiconductor package device in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1 illustrates a cross-sectional view of a semiconductor package device 1 in accordance with some embodiments of the present disclosure. The semiconductor package device 1 includes a substrate 10, an electronic component 11a, an electronic component 11b, a package body 12, a shielding wall 13, and a cover 14.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element.

The electronic components 11a and 11b are disposed on the substrate 10. The electronic components 11a and 11b may be active components or passive components or a combination thereof. An active electronic component may be, for example, an integrated chip (IC) or a die. A passive electronic component may be, for example, a capacitor, a resistor or an inductor. The electronic components 11a and 11b may be electrically connected to the substrate 10 by way of flip-chip or wire-bond techniques.

The shielding wall 13 is disposed on the carrier 10 and between the electronic component 11a and the electronic component 11b. For example, the electronic component 11a and the electronic component 11b are separated from each other by the shielding wall 13. In some embodiments, the shielding wall 13 is a compartment shield. In some embodiments, the shielding wall 13 is connected to a ground through a conductive pad disposed on, or constituting part of, the substrate 10, or through the cover 14. The shielding wall 13 may include, for example, aluminum (Al), copper (Cu), chromium (Cr), tin (Sn), gold (Au), silver (Ag), nickel (Ni), stainless steel, another metal, a mixture or an alloy thereof, or other combination thereof. In some embodiments, the shielding wall 13 may be formed by operations that include the following operations: (i) forming a trench penetrating the package body 12 to expose a ground pad on the substrate 10; and (ii) filling or disposing conductive materials in the trench using, for example, vacuum printing or other suitable processes. In some embodiments, in the operation (i), the trench may be formed such that it is tapered from the top surface of the package body 12 toward the substrate 10.

The package body 12 is disposed on the substrate 10 to cover or encapsulate the electronic components 11a, 11b and at least a portion of the shielding wall 13. In some embodiments, a top surface (or an upper portion) of the shielding wall 13 is exposed from the package body 12. In some embodiments, the package body 12 includes an epoxy resin having fillers, a molding compound (e.g., an epoxy molding compound or other molding compound), a polyimide, a phenolic compound or material, a material with a silicone dispersed therein, or a combination thereof.

The cover 14 is disposed on an external surface of the package body 12 and covers the electronic components 11a, 11b, the package body 12 and the shielding wall 13. In some embodiments, the cover 14 contacts the top surface of the shielding wall 13 that is exposed from the package body 12. In some embodiments, the cover 14 is a conformal shield (e.g. is conformal to at least a portion of the package body 12, such as a top surface of the package body 12). The cover 14 may include a conductive layer. In some embodiments, the cover 14 is electrically connected to a ground pad on the substrate 10. In some embodiments, the cover 14 includes a conductive thin film, and may include, for example, Al, Cu, Cr, Sn, Au, Ag, Ni, stainless steel, a mixture or an alloy thereof, or other combination thereof. The cover 14 may include a single conductive layer or multiple conductive layers. In one or more embodiments in which the cover 14 includes multiple conductive layers, the multiple conductive layers each may include a same material, or one or more of the multiple conductive layers may include different materials, or each of the multiple conductive layers may include different materials from the other conductive layers of the multiple conductive layers.

Separately or together, the shielding wall 13 and the cover 14 can reduce the effect of electromagnetic emissions (e.g., EMI or cross-talk). For example, the shielding wall 13 and the cover 14 can block (at least in part) electromagnetic emissions generated outside the shielding wall 13 and the cover 14 from being received by the electronic components 11a, 11b, block (at least in part) electromagnetic emissions emanating from within the semiconductor package device 1 from leaving the semiconductor package device 1, and/or block (at least in part) electromagnetic emissions transmitted between the electronic components 11a and 11b.

Figure 1B:
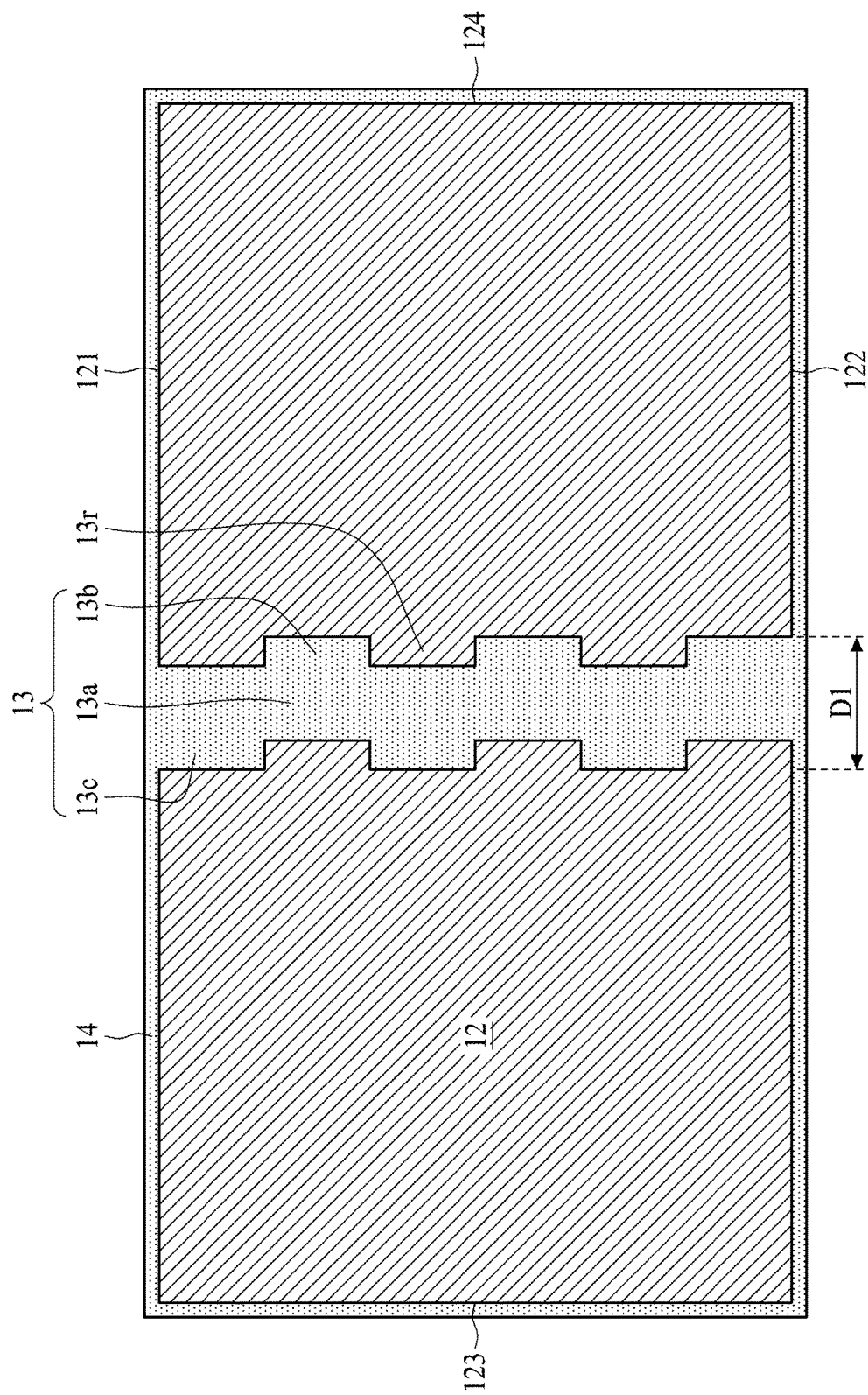
FIG. 1B illustrates a top view of a semiconductor package device in accordance with some embodiments of the present disclosure.

FIG. 1B illustrates a top view of the semiconductor package device 1 in accordance with some embodiments of the present disclosure. As shown in FIG. 1B, the shielding wall 13 includes a main body 13a (e.g. a conductive main body), one or more protruding portions (e.g. conductive protruding portions) 13b extending from the main body 13a, and one or more protruding portions 13c extending from the main body 13a. In some embodiments, the protruding portions 13b extend horizontally toward a first side (e.g. the right side according to the orientation shown in FIG. 1B) of the main body 13a while the protruding portions 13c extend horizontally toward a second side (e.g. the left side of the main body 13a according to the orientation shown in FIG. 1B). In some embodiments, each of the protruding portions 13b is separated from adjacent protruding portions 13b. For example, the shielding wall 13 defines a recess 13r between two adjacent protruding portions 13b (e.g. between each two adjacent protruding portions 13b). Similarly, each of the protruding portions 13c is separated from adjacent protruding portions 13c (e.g. by a recess). In some embodiments, a width of the main body 13a is about 45 micrometers (μm)

(such as, for example, about 35 μm, about 40 μm, about 50 μm, about 55 μm, or anywhere in a range of about 35 μm to about 55 μm) and a distance D1 between the second side of the protruding portion 13c and the first side of the protruding portion 13b is about 120 μm (such as, for example, about 110 μm, about 115 μm, about 125 μm, about 130 μm, or anywhere in a range of about 110 μm to about 130 μm).

In some comparative implementations, the shielding wall may include the main body having a thickness that corresponds to the distance D1 and may omit protruding portions. Compared with the shielding wall that omits protruding portions, the shielding wall 13 shown in FIG. 1B can be made using less material. For example, compared with the shielding wall that omits protruding portions, material to fill the recess 13r of the shielding wall 13 can be omitted. Therefore, the manufacturing cost of the shielding wall 13 can be reduced without significantly affecting the shielding performance.

In some embodiments, as shown in FIG. 1B, the shielding wall 13 can extend from a lateral surface 121 of the package body 12 to an opposite lateral surface 122 of the package body 12 (e.g. the shielding wall 13 can traverse the package body 12). For example, one terminal or end of the shielding wall 13 directly contacts, or is adjacent to, the lateral surface 121 of the package body 12 while the other terminal of the shielding wall 13 directly contacts, or is adjacent to, the lateral surface 122 of the package body 12. In some embodiments, the shielding wall 13 can extend within the package body 12 without contacting the lateral surface 121 and/or 122 of the package body 12. For example, a gap may exist between the terminals of the shielding wall 13 and the lateral surface 121 or 122 of the package body 12 (e.g. such that the terminals of the shielding wall 13 are not adjacent to the lateral surface 121 or 122 of the package body 12). In some embodiments, the shielding wall 13 can extend from one lateral surface of the package body 12 toward any other lateral surface of the package body 12. For example, the shielding wall 13 may extend from the lateral surface 121 of the package body 12 toward the lateral surface 122, 123 or 124 of the package body 12 according to design specifications.

Figure 1C:
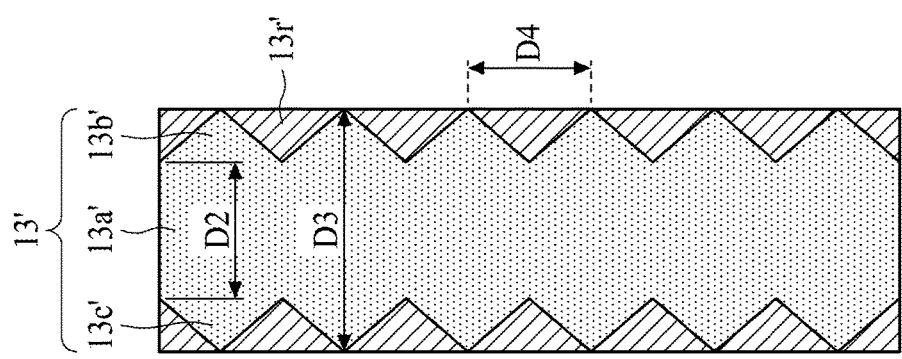
FIG. 1C illustrates a top view of a shielding wall in accordance with some embodiments of the present disclosure.

FIG. 1C illustrates a top view of a shielding wall 13' of the semiconductor package device 1 in accordance with some embodiments of the present disclosure. The shielding wall 13' shown in FIG. 1C is similar to the shielding wall 13 shown in FIG. 1B, except that the one or more protruding portions 13b and the one or more protruding portions 13c included in the shielding wall 13 shown in FIG. 1B are, in one or more embodiments, substantially square-shaped or rectangle-shaped, while one or more protruding portions 13b' and one or more protruding portions 13c' included in the shielding wall 13' shown in FIG. 1C are substantially triangle-shaped. In some embodiments, the protruding portions 13b' extend horizontally toward a first side (e.g. the right side according to the orientation shown in FIG. 1C) of the main body 13a' while the protruding portions 13c' extend horizontally toward a second side (e.g. the left side according to the orientation shown in FIG. 1C) of the main body 13a'. In some embodiments, the shielding wall 13 defines a recess 13r' between two adjacent protruding portions 13b' or 13c'.

In some embodiments, a width D2 of the main body 13a' is about 45 μm (such as, for example, about 35 μm, about 40 μm, about 50 μm, about 55 μm, or anywhere in a range of about 35 μm to about 55 μm), a distance D3 between a peak portion of one or more of the protruding portions 13c' (e.g. a portion of the one or more of the protruding portions 13c' that is farthest away from the main body 13a') and a peak portion of one or more of the protruding portions 13b' (e.g. a portion of the one or more of the protruding portions 13b' that is farthest away from the main body 13a') is about 120 μm (such as, for example, about 110 μm, about 115 μm, about 125 μm, about 130 μm, or anywhere in a range of about 110 μm to about 130 μm), and a distance D4 between peak portions of two adjacent protruding portions 13b', or two adjacent protruding portions 13c', is about 78 μm (such as, for example, about 68 μm, about 73 μm, about 83 μm, about 88 μm, or anywhere in a range of about 68 μm to about 88 μm). In some embodiments, an angle defined by one or more peak portions of the protruding portions 13b' or 13c' is about 120 degrees (such as, for example, about 110 degrees, about 115 degrees, about 125 degrees, about 130 degrees, or anywhere in a range of about 110 degrees to about 130 degrees).

Figure 1D:
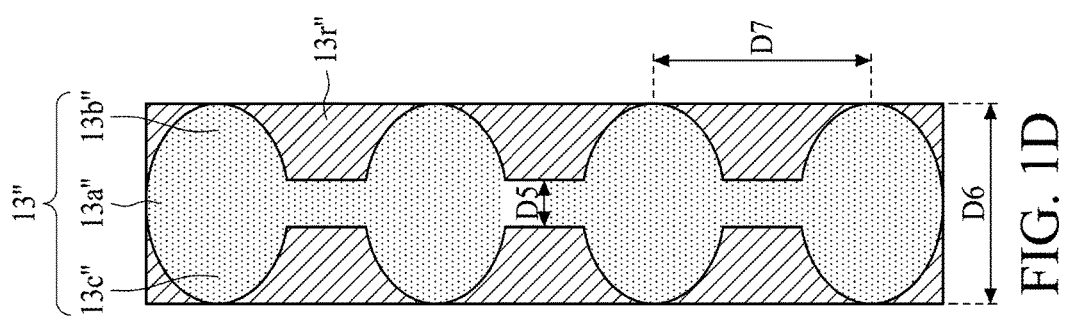
FIG. 1D illustrates a top view of a shielding wall in accordance with some embodiments of the present disclosure.

FIG. 1D illustrates a top view of a shielding wall 13" of the semiconductor package device 1 in accordance with some embodiments of the present disclosure. The shielding wall 13" shown in FIG. 1D is similar to the shielding wall 13 shown in FIG. 1B, except that the one or more protruding portions 13b, 13c of the shielding wall 13 shown in FIG. 1B are, in one or more embodiments, substantially square-shaped or rectangle-shaped while one or more protruding portions 13b" and one or more protruding portions 13c" included in the shielding wall 13" shown in FIG. 1D are curved. For example, a protruding portion 13b" and a protruding portion 13c" disposed opposite to the protruding portion 13b" may define, at least in part, a round or substantially circle-shaped structure. In some embodiments, the protruding portions 13b" extend horizontally toward a first side (e.g. the right side according to the orientation shown in FIG. 1D) of the main body 13a" while the protruding portions 13c" extend horizontally toward a second side (e.g. the left side according to the orientation shown in FIG. 1D) of the main body 13a". In some embodiments, the shielding wall 13" defines a recess 13r" between two adjacent protruding portions 13b", or two adjacent protruding portions 13c".

In some embodiments, a width D5 of the main body 13a" is about 45 μm (such as, for example, about 35 μm, about 40 μm, about 50 μm, about 55 μm, or anywhere in a range of about 35 μm to about 55 μm), a diameter D6 of a circle defined by the main body 13a" and opposing protruding portions 13b" and 13c" is about 120 μm (such as, for example, about 110 μm, about 115 μm, about 125 μm, about 130 μm, or anywhere in a range of about 110 μm to about 130 μm) and a distance D7 between peak portions of two adjacent protruding portions 13b' or two adjacent protruding portions 13c" (e.g. a portion of the one or more of the protruding portions 13b" or the protruding portions 13c" that is furthest away from the main body 13a") is about 320 μm (such as, for example, about 300 μm, about 310 μm, about 330 μm, about 340 μm, or anywhere in a range of about 300 μm to about 340 μm).

Figure 1E:
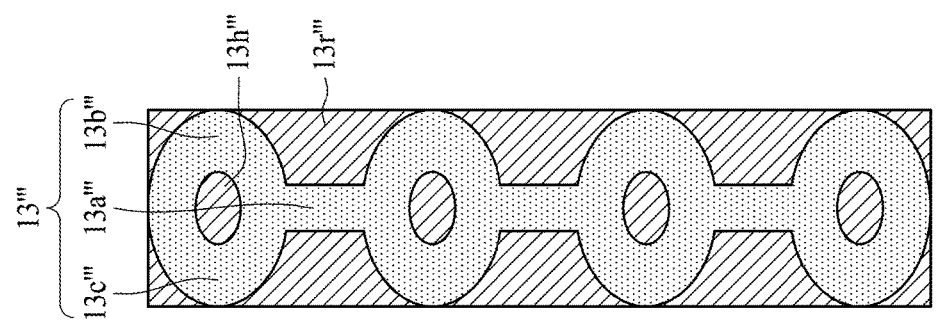
FIG. 1E illustrates a top view of a shielding wall in accordance with some embodiments of the present disclosure.

FIG. 1E illustrates a top view of a shielding wall 13''' of the semiconductor package device 1 in accordance with some embodiments of the present disclosure. The shielding wall 13''' shown in FIG. 1E is similar to the shielding wall 13" shown in FIG. 1D, except that the shielding wall 13''' further includes a through hole (or location-arranged hole) 13h''' penetrating the shielding wall 13''' and substantially filled by the package body 12. In some embodiments, a depth of the through hole 13h''' is substantially the same as a height of the shielding wall 13''' (e.g. the through hole 13h''' traverses the shielding wall 13'''). In some embodiments, a diameter of the through hole 13h''' or a longest chord that crosses the through hole 13h''' can be less than, equal to or greater than a width of the main body 13a''' depending on design specifications. For example, the through hole 13h' can be surrounded by (e.g. defined at least in part by) the protruding portions 13b''' and 13c''' or by the main body 13a'''. When an electromagnetic wave is radiated to the shielding wall 13''', a first portion of the electromagnetic wave is reflected by an outer surface of the protruding portions 13b''' and 13c''', and a second portion of the electromagnetic wave may be radiated or transmitted to an inner surface of the through hole 13h'''. The inner surface of the through hole 13h''' can reflect the second portion of the electromagnetic wave (e.g. may provide for a second reflection opportunity) to increase the shielding performance. Thus, when the electromagnetic wave is radiated to the shielding wall 13''', at least two reflections might occur to attenuate the energy of the electromagnetic wave.

Figure 1F:
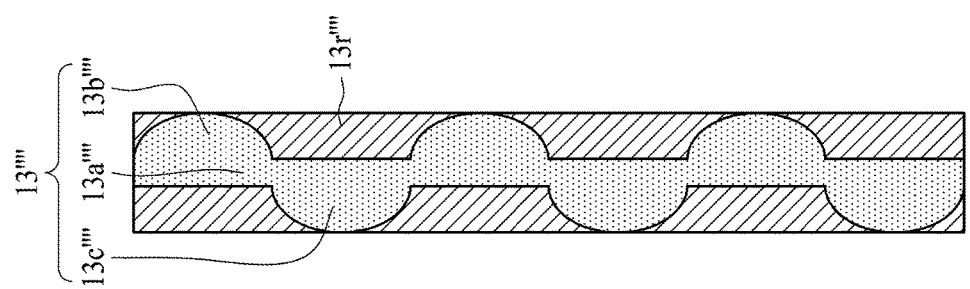
FIG. 1F illustrates a top view of a shielding wall in accordance with some embodiments of the present disclosure.

FIG. 1F illustrates a top view of a shielding wall 13'''' of the semiconductor package device 1 in accordance with some embodiments of the present disclosure. The shielding wall 13'''' shown in FIG. 1F is similar to the shielding wall 13'' shown in FIG. 1D, except that in FIG. 1D, the main body 13a'', a protruding portion 13b'' and a protruding portion 13c'' define, in one or more embodiments, a circle-shaped structure while in FIG. 1F, the main body 13a'''', and/or a protruding portion 13b'''' and/or a protruding portion 13c'''' define a substantially semicircle-shaped structure. In some embodiments, the protruding portions 13b'''' extend horizontally toward a first side (e.g. the right side according to the orientation shown in FIG. 1F) of the main body 13a'''' while the protruding portions 13c'''' extend horizontally toward a second side (e.g. the left side according to the orientation shown in FIG. 1F) of the main body 13a''''. In some embodiments, the shielding wall 13'''' defines a recess 13r'''' between two adjacent protruding portions 13b'''' or two adjacent protruding portions 13c''''.

Figure 1G:
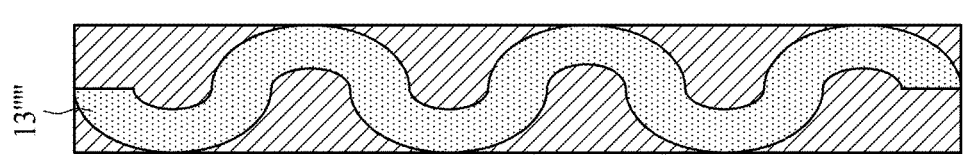
FIG. 1G illustrates a top view of a shielding wall in accordance with some embodiments of the present disclosure.

FIG. 1G illustrates a top view of a shielding wall 13''''' of the semiconductor package device 1 in accordance with some embodiments of the present disclosure. As shown in FIG. 1G, the shielding wall 13''''' is curved. Compared with a straight shielding wall having a thickness identical to the shielding wall 13''''', the shielding wall 13''''' has a better shielding performance.

Figure 1H:
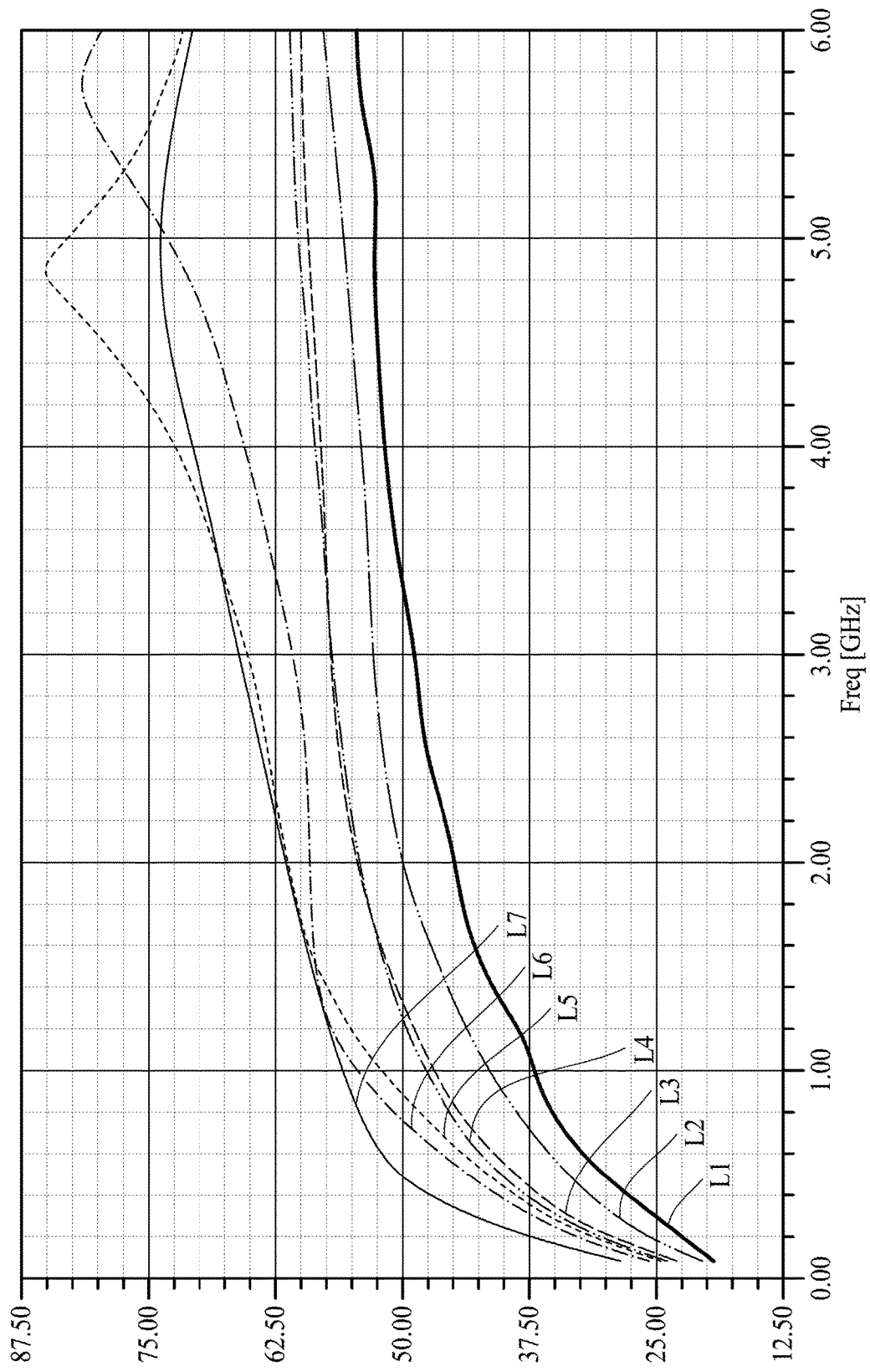
FIG. 1H illustrates simulation results of shielding walls in accordance with some embodiments of the present disclosure.

FIG. 1H is a diagram showing simulation results of different types of shielding walls in accordance with some embodiments of the present disclosure, in which the x-axis represents operation frequency in gigahertz (GHz) of the semiconductor package device, and the y-axis represents a shielding effect in decibels (dB). In FIG. 1H, Line L1 represents a simulation result of a straight shielding wall (e.g., including a main body and omitting protrusion portions) with a thickness of 45 µm; Line L2 represents a simulation result of the shielding wall 13''''' shown in FIG. 1G with a thickness of 45 µm; Line L3 represents a simulation result of the shielding wall 13''' shown in FIG. 1E in which a diameter of a circle defined by the main body 13a''' and opposing protruding portions 13b''' and 13c''' is about 120 µm; Line L4 represents a simulation result of the shielding wall 13'' shown in FIG. 1D in which the diameter D6 of a circle defined by the main body 13a'' and opposing protruding portions 13b'' and 13c'' is about 120 µm; Line L5 represents a simulation result of the shielding wall 13 shown in FIG. 1B in which the width D1 is about 120 µm or FIG. 1F (the simulation result of FIG. 1F is substantially the same as that of FIG. 1B); Line L6 represents a simulation result of the shielding wall 13' shown in FIG. 1C in which the width D3 is about 120 µm; and Line L7 represents a simulation result of a straight shielding wall (e.g., including a main body and omitting protrusion portions) with a thickness of 120 µm.

As shown by Line 1 and Line 2 shown in FIG. 1H, the curved shielding wall has better shielding performance than the straight shielding wall with the same thickness. In addition, according to Lines 5, 6, and 7, the shielding performances of the shielding walls 13, 13' and 13'''' respectively shown in FIG. 1B, FIG. 1C and FIG. 1F are similar to the shielding performance the straight shielding wall (e.g., including a main body and omitting protrusion portions). As shown by Lines 3, 4 and 7, although the shielding performances of the shielding walls 13'' and 13''' are worse than the shielding performance of the straight shielding wall (e.g., including a main body and omitting protrusion portions), they still meet some EMI shielding specifications (e.g., a reduction of an electromagnetic wave of about 30 dB (such as, for example, about 20 dB, about 25 dB, about 35 dB, about 40 dB, or anywhere in a range of about 20 dB to about 40 dB)). Therefore, compared with the shielding wall having the main body, the shielding wall shown in FIG. 1B, FIG. 1C, FIG. 1D, FIG. 1E, FIG. 1F, and FIG. 1G can be made using less material, which would reduce the manufacturing cost without significantly affecting the shielding performance.

Figure 2A:
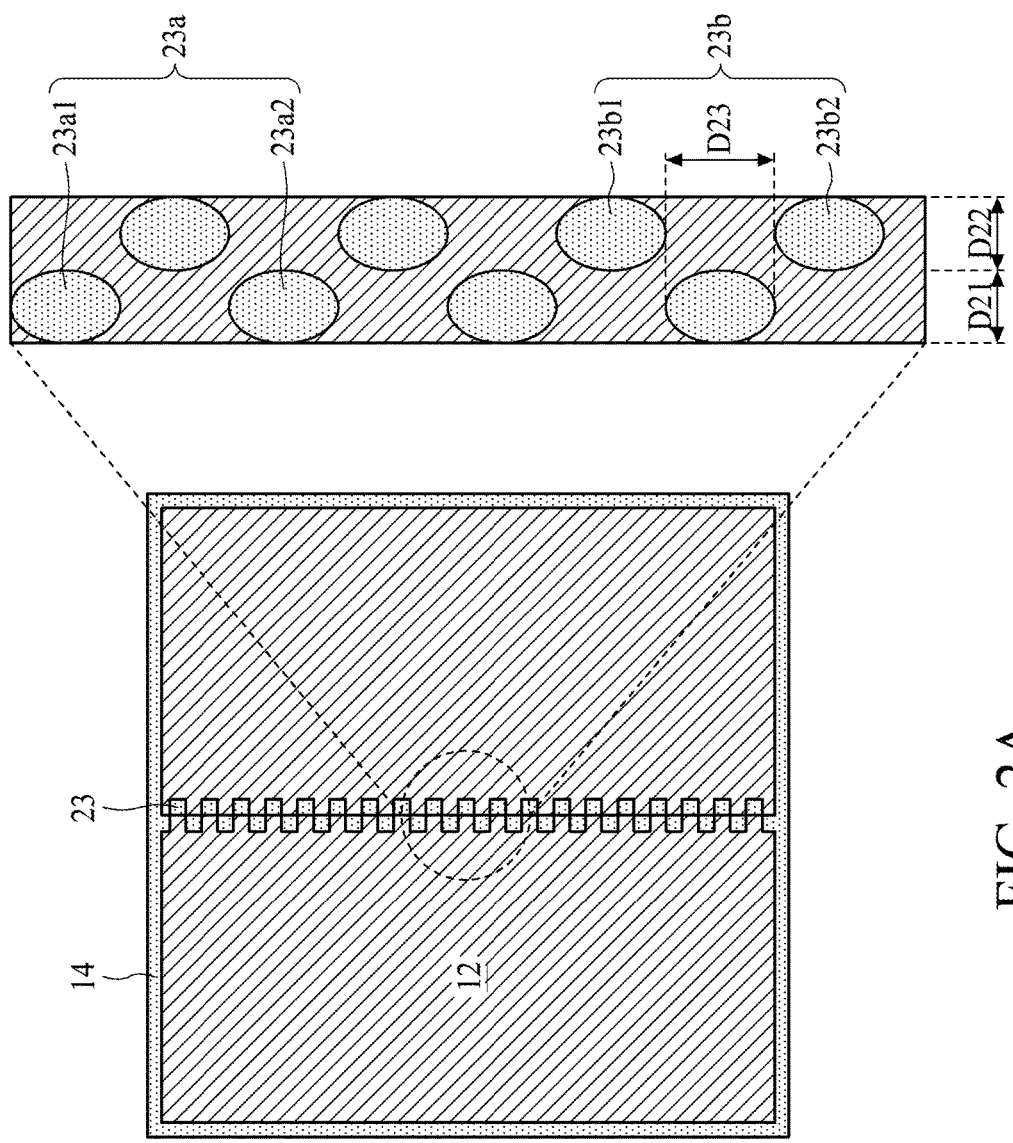
FIG. 2A illustrates a top view of a semiconductor package device and an enlarged view of a portion of a shielding wall in accordance with some embodiments of the present disclosure.

FIG. 2A illustrates a top view of the semiconductor package device 1 and an enlarged view of a portion of a shielding wall 23 in accordance with some embodiments of the present disclosure. As shown in FIG. 2A, the shielding wall 23 includes a set of conductive columns 23a and a set of conductive columns 23b. The set of conductive columns 23a includes a plurality of conductive bars (or columns) including the conductive bar 23a1 and the conductive bar 23a2. The set of conductive columns 23b includes a plurality of conductive bars including the conductive bar 23b1 and the conductive bar 23b2. The conductive bars 23a1 and 23a2 are separated from each other. The conductive bars 23b1 and 23b2 are separated from each other. In some embodiments, a distance D23 between two adjacent conductive bars (e.g., between conductive bars 23a1 and 23a2, or between conductive bars 23b1 and 23b2) is about 40 µm (such as, for example, about 30 µm, about 35 µm, about 45 µm, about 50 µm, or anywhere in a range of about 30 µm to about 50 µm). In some embodiments, a width D21 of the conductive bar 23a1 or the conductive bar 23a2 is the about equal to a width D22 of the conductive bar 23b1 or the conductive bar 23b2. In some embodiments, the width D21 of the conductive bar 23a1 or the conductive bar 23a2 is different from the width D22 of the conductive bar 23b1 or the conductive bar 23b2. In some embodiments, both of the widths D21 and D22 are about 40 µm (such as, for example, about 30 µm, about 35 µm, about 45 µm, about 50 µm, or anywhere in a range of about 30 µm to about 50 µm). In some embodiments, a ratio of a width (e.g. D21 or D22) of the conductive bar 23a1, the conductive bar 23a2, the conductive bar 23b1 or the conductive bar 23b2 to a pitch (e.g. D23) of the set of conductive columns 23a or the set of conductive columns 23b is greater than or equal to about 0.5 and less than about 1. Referring now to FIG. 2C, FIG. 2C is a diagram showing simulation results of the shielding wall 23 with different widths (20 µm, 40 µm, 80 µm, 160 µm, 320 µm and 640 µm) of conductive bars, in accordance with some embodiments of the present disclosure. In FIG. 2C, the x-axis represent a ratio of the width of a conductive bar to a pitch of a set of conductive columns including the conductive bar, and y-axis represents a shielding effect (dB). As shown in FIG. 2C, when a ratio of a width of the conductive bar of the set of conductive columns to a pitch of the set of conductive columns is greater than or equal to 0.5 and less than 1, the shielding effect would be greater than 30 dB regardless of the width of the bar (excepting for the width of 20 µm, which corresponds to slightly less than 30 dB at a ratio of 0.5, but still provides for a strong decibel value).

Figure 2B:
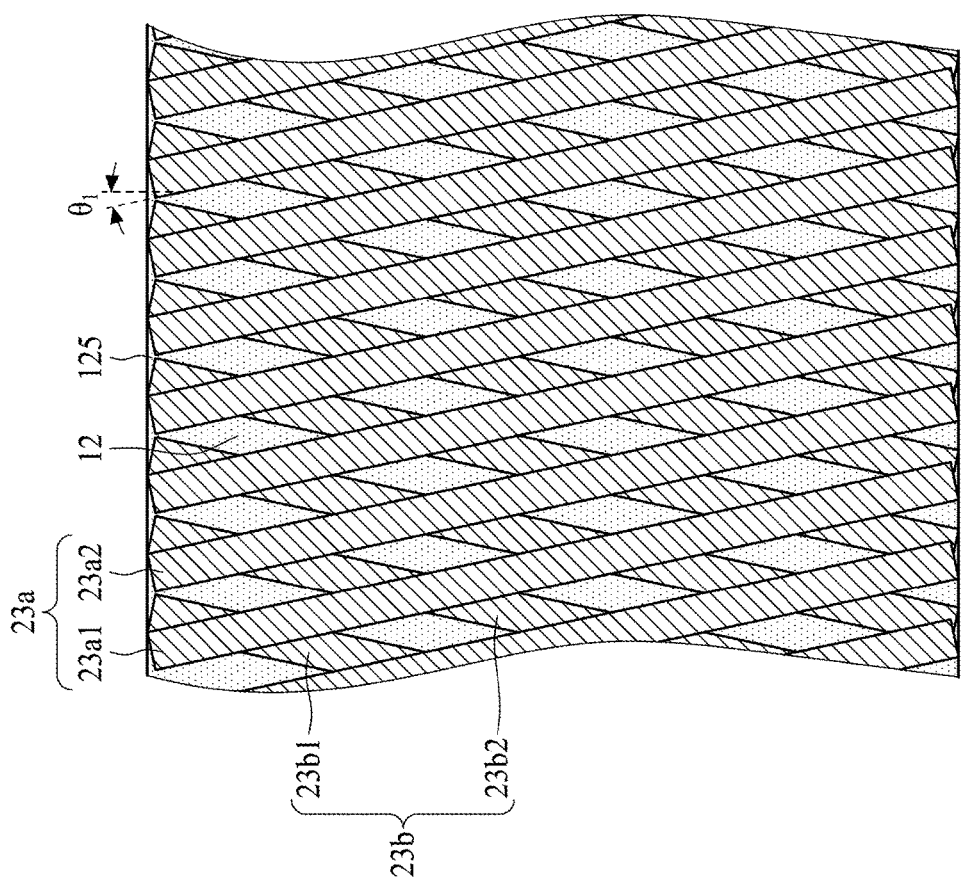
FIG. 2B illustrates a side view of a shielding wall in accordance with some embodiments of the present disclosure.
Figure 2C:
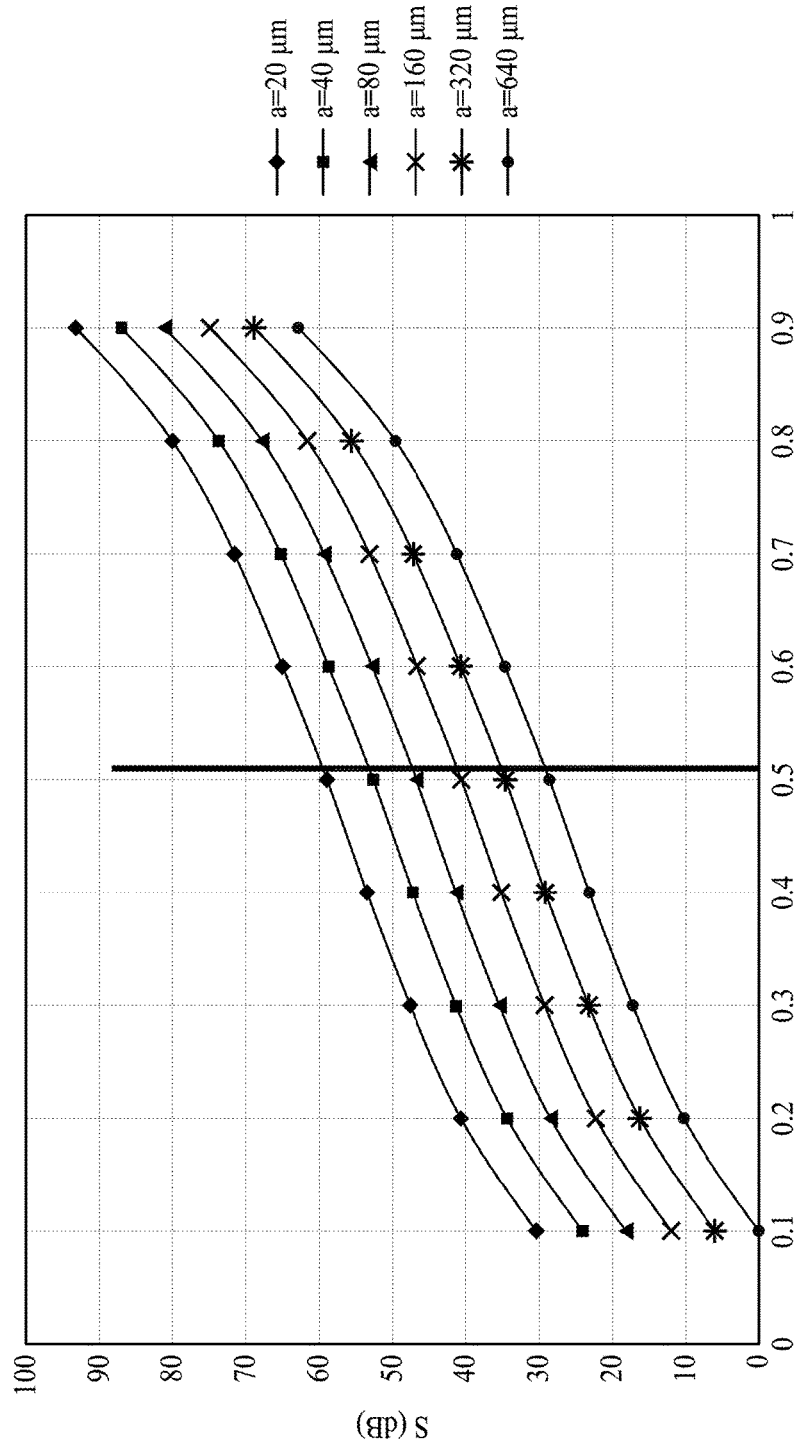
FIG. 2C illustrates simulation results of shielding walls in accordance with some embodiments of the present disclosure.

FIG. 2B illustrates a side view of the shielding wall 23 in accordance with some embodiments of the present disclosure. As shown in FIG. 2B, the set of conductive columns 23a and the set of conductive columns 23b are in staggered arrangement (or interlaced). For example, the conductive bar 23a1 of the set of conductive columns 23a is disposed across at least one conductive bar (e.g., 23b1 or 23b2) of the set of conductive columns 23b. For example, the set of the conductive columns 23a and the set of the conductive columns 23b are arranged in different rows. In one or more embodiments one or more conductive columns of the set of conductive columns 23a and one or more conductive columns of the set of conductive columns 23b may intersect, merge with, or contact each other. For example, the set of conductive columns 23a is arranged in (e.g. is tilted in) a first direction and the set of conductive columns 23b is arranged in (e.g. is tilted in) a second direction different from the first direction. In some embodiments, an angle $\theta_1$ defined by each bar of the set of conductive columns 23a or the set of conductive columns 23b and a normal of a top surface 125 of the package body 12 is greater than about 0 (zero) degrees and less than or equal to about 45 degrees. For example, a projected area of at least one of the conductive bars 23a1, 23a2, 23b1 or 23b2 on the top surface of the substrate 10 is greater than a cross-sectional area (e.g., a cross-sectional area of the conductive bar that is exposed from the package body 12) of the at least one conductive bar 23a1, 23a2, 23b1 or 23b2.

In some embodiments, at least one of the conductive bars 23a1, 23a2, 23b1 or 23b2 of the set of conductive columns 23a or 23b extends from the top surface 125 of the package body 12 to the top surface of the substrate 10 (e.g. traverses the package body 12). For example, a top surface (or an upper portion) of at least one of the conductive bars 23a1, 23a2, 23b1 or 23b2 of the set of conductive columns 23a or 23b is exposed from the package body 12. In some embodiments, at least one of the conductive bars 23a1, 23a2, 23b1 or 23b2 of the set of conductive columns 23a or 23b is disposed within the package body 12 and substantially covered or encapsulated (e.g. completely covered or encapsulated) by the package body 12. In some embodiments, at least one of the conductive bars 23a1, 23a2, 23b1 or 23b2 of the set of conductive columns 23a or 23b is substantially cylinder-shaped. In some embodiments, the shielding wall 23 can be formed by operations that include the following operations: (i) forming a plurality of through holes to penetrate the package body 12 by, for example, laser drilling or etching; and (ii) substantially filing or disposing a conductive material in the through holes.

In accordance with the embodiments shown in FIG. 2A and FIG. 2B, since the shielding wall 23 includes gaps in which conductive material (e.g., Cu or Al or another metal) may be omitted, the manufacturing cost of the shielding wall 23 is reduced while specifications for shielding performance still can be satisfied.

Figure 3A:
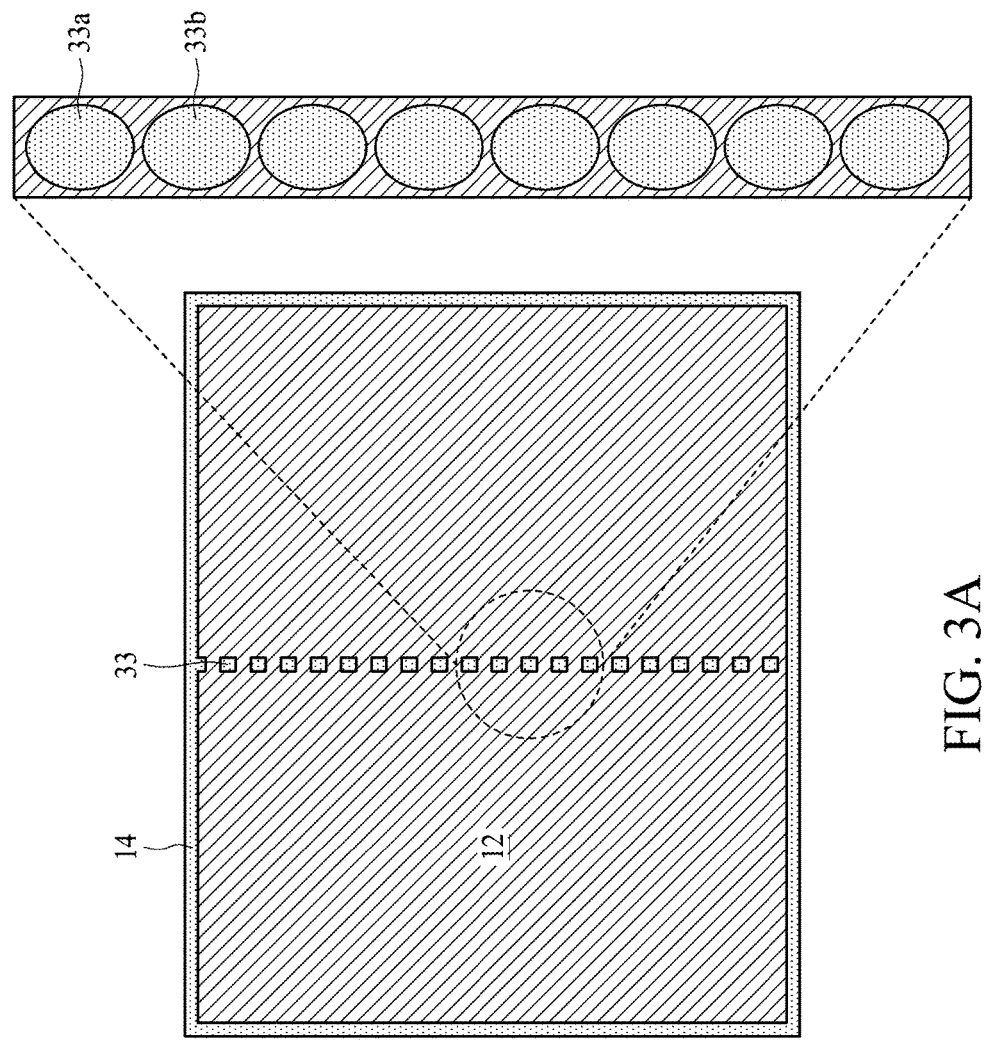
FIG. 3A illustrates a top view of a semiconductor package device and an enlarged view of a portion of a shielding wall in accordance with some embodiments of the present disclosure.

FIG. 3A illustrates a top view of the semiconductor package device 1 and an enlarged view of a portion of a shielding wall 33 in accordance with some embodiments of the present disclosure. The shielding wall 33 is similar to the shielding wall 23 shown in FIG. 2A except that in the shielding wall 23, two sets of conductive columns 23a and 23b are disposed at different rows while in the shielding wall 33, two sets of conductive columns 33a and 33b are disposed at a same row (e.g. in a line).

Figure 3B:
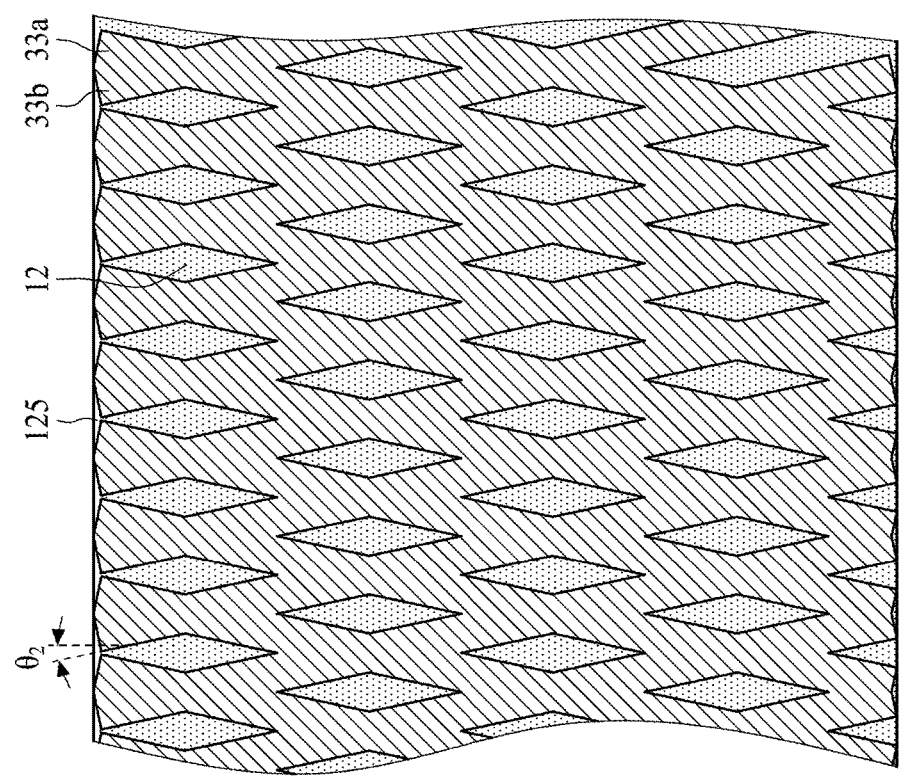
FIG. 3B illustrates a side view of a shielding wall in accordance with some embodiments of the present disclosure.

FIG. 3B illustrates a side view of the shielding wall 33 in accordance with some embodiments of the present disclosure. As shown in FIG. 3B, each conductive bar of the set of conductive columns 33a intersects (e.g. touches or merges with) at least one bar of the set of conductive columns 33b. For example, the set of conductive columns 33a is arranged in (e.g. is tilted in) a first direction and the set of conductive columns 33b is arranged in (e.g. is tilted in) a second direction different from the first direction. In some embodiments, an angle $\theta_2$ defined by each conductive bar of the set of conductive columns 33a or 33b and the normal of the top surface 125 of the package body 12 is greater than about 0 (zero) degrees and less than or equal to about 45 degrees. For example, a projected area of each conductive bar of the set of conductive columns 23a or 23b on the top surface of the substrate 10 is greater than a cross-sectional area (e.g., a cross-sectional area of the bar that is exposed from the package body 12) of the conductive bar.

FIG. 4A illustrates a top view of the semiconductor package device 1 in accordance with some embodiments of the present disclosure; FIG. 4B illustrates an enlarged view of a portion of a shielding wall 43 in accordance with some embodiments of the present disclosure; and FIG. 4C illustrates a perspective view of a portion of the shielding wall 43 in accordance with some embodiments of the present disclosure. As shown in FIG. 4B, the shielding wall 43 includes a plurality of conductive members including a conductive member 43a and a conductive member 43b disposed adjacent to each other. As shown in FIG. 4C, the conductive member 43a includes a core 43a1, an inner layer 43a2 and an outer layer 43a3. The inner layer 43a2 surrounds or covers the core 43a1 and the outer layer 43a3 surrounds or covers the inner layer 43a2. In some embodiments, the conductive members 43a, 43b can include epoxy mixed with conductive fillers (such as, for example, Au, Ag, Cu, iron (Fe) or silicon (Si) coated with Cu or another metal). In some embodiments, a thixotropic index of the conductive members 43a, 43b is greater than about 3 (at a temperature of 25 degrees Celsius, centiPascal-seconds (cPa*s) less than 10000, and a rotational speed in a range of about 0.5 rotations-per-minute (rpm) to about 5 rpm), such as, for example, about 4, about 5, about 6, about 7, about 8, about 9, about 10, or greater.

In some embodiments, a dielectric constant ($\varepsilon_2$) of the inner layer 43a2 is greater than a dielectric constant ($\varepsilon_1$) of the core 43a1, and a dielectric constant ($\varepsilon_3$) of the outer layer 43a3 is greater than the dielectric constant of the inner layer 43a2. In some embodiments, $\varepsilon_2$ is in a range from about $\varepsilon_1+0.1$ to about $\varepsilon_1+1$, and $\varepsilon_3$ is in a range from about $\varepsilon_1+1$ to about $\varepsilon_1+2$. In some embodiments, a conductivity of the outer layer 43a3 is greater than a conductivity of the inner layer 43a2 and the conductivity of the inner layer 43a2 is greater than a conductivity of the core 43a1. In some embodiments, thicknesses of the core 43a1, the inner layer 43a2 and the outer layer 43a3 are different from each other. For example, the thickness of the outer layer 43a3 is greater than the thickness of the inner layer 43a2, and the thickness of the inner layer 43a2 is greater than the thickness of the core 43a1.

In some embodiments, the core 43a1 may include Cu, the inner layer 43a2 may include Ni and the outer layer 43a3 may include a carbon nanotube (CNT). In some comparative implementations, the shielding layer includes Ag, which can be an expensive material. By replacing Ag with a three-layer structure including the core 43a1, the inner layer 43a2 and the outer layer 43a3, which can be relatively less expensive, the manufacturing cost of the shielding wall 43 can be reduced while the specifications for shielding performance still can be satisfied.

Figure 4D:
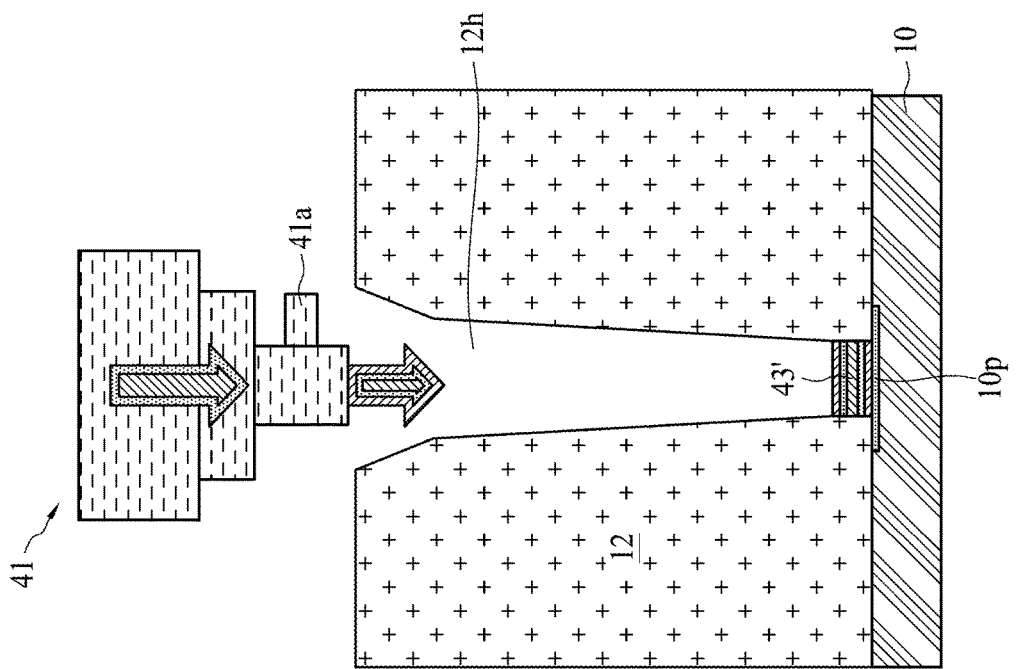
FIG. 4D illustrates a process for manufacturing a shielding wall in accordance with some embodiments of the present disclosure.

FIG. 4D illustrates a process for manufacturing the shielding wall 43 in accordance with some embodiments of the present disclosure. In some embodiments, the operations shown in FIG. 4D can be carried out after forming a package body 12 on a substrate 10 and forming a trench 12h to penetrate the package body 12 to expose a ground pad 10p on the substrate 10. As shown in FIG. 4D, a nozzle 41 is configured to dispense or apply a conductive material 43' on the top surface of the substrate 10 until the conductive material 43' reaches the height of the package body 12 to form the conductive member 43a as shown in FIG. 4C. In some embodiments, the nozzle 41 may include a curing apparatus 41a configured to radiate ultraviolet (UV) light to cure the conductive material 43' after dispensing or applying the conductive material 43' on the substrate 10. After the conductive member 43a is formed, the nozzle 41 moves horizontally along the substrate 10 to form another conductive member (e.g., a conductive member 43b). The above operations may be repeatedly carried out until the shielding wall 43 shown in FIG. 4A is completely formed.

Figure 4F:
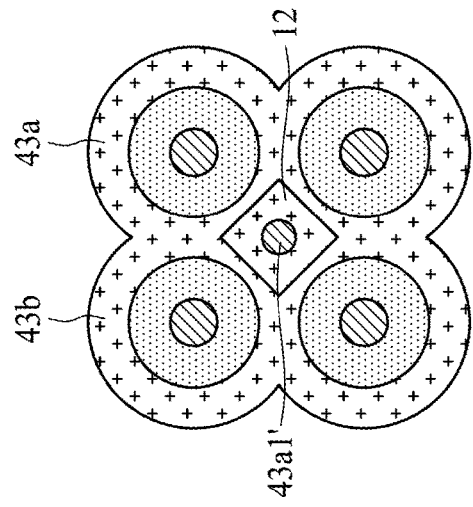
FIG. 4F illustrates an enlarged view of conductive members of a shielding wall in accordance with some embodiments of the present disclosure.
Figure 4E:
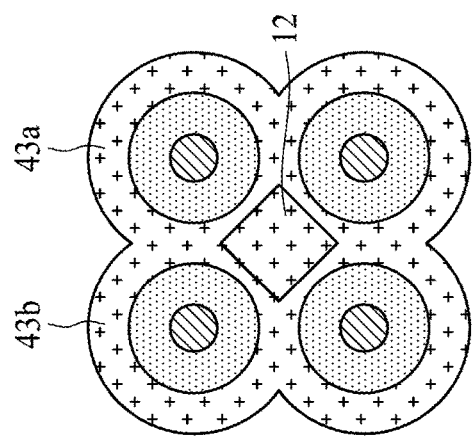
FIG. 4E illustrates an enlarged view of conductive members of a shielding wall in accordance with some embodiments of the present disclosure.

In some embodiments, there is a gap between the conductive member 43a and an adjacent conductive member 43b, and the gap is substantially filled by the package body 12 as shown in FIG. 4E. In some embodiments, a conductive core 43a1' may be disposed between the conductive member 43a and the adjacent conductive member 43b as shown in FIG. 4F. In some embodiments, the conductive core 43a1' is covered or encapsulated by the package body 12.

FIG. 5A illustrates a top view of the semiconductor package device 1 in accordance with some embodiments of the present disclosure; FIG. 5B illustrates an enlarged view of a portion of a shielding wall 53 in accordance with some embodiments of the present disclosure; and FIG. 5C illustrates a side view of a portion of a shielding wall 53 in accordance with some embodiments of the present disclosure. The shielding wall 53 is similar to the shielding wall 43 shown in FIG. 4A except that the conductive members 43a, 43b of the shielding wall 43 are arranged vertically on the substrate 10 while a conductive member 53a (e.g. including a core 53a1, an inner layer 53a2 and an outer layer 53a3) and a conductive member 53b of the shielding wall 53 are arranged horizontally on the substrate 10. Therefore, the core 43a1, the inner layer 43a2 and the outer layer 43a3 of the conductive member 43a can be seen from a top view (e.g., as shown in FIG. 4B) of shielding wall 43 while the outer layer 53a3 of the conductive member 53a can be seen from the top view (e.g., as shown in FIG. 5B) of the shielding wall 53, and the core 53a1 and the inner layer 53a2 of the conductive member 53a may not be visible from the top view. The core 53a1, the inner layer 53a2 and the outer layer 53a3 of the conductive member 53a can be seen from a side view (e.g., as shown in FIG. 5C) or cross-sectional view of shielding wall 53. Thus, a boundary between the conductive member 53a and the conductive member 53b (e.g. the outer layer 53a3 or another boundary) may be disposed parallel to a top surface of a substrate 10 on which the shielding wall 53 is disposed, while a boundary between the conductive member 43a and the conductive member 43b (e.g. the outer layer 43a3 or another boundary) may be disposed perpendicular to a top surface of a substrate 10 on which the shielding wall 43 is disposed.

Figure 5D:
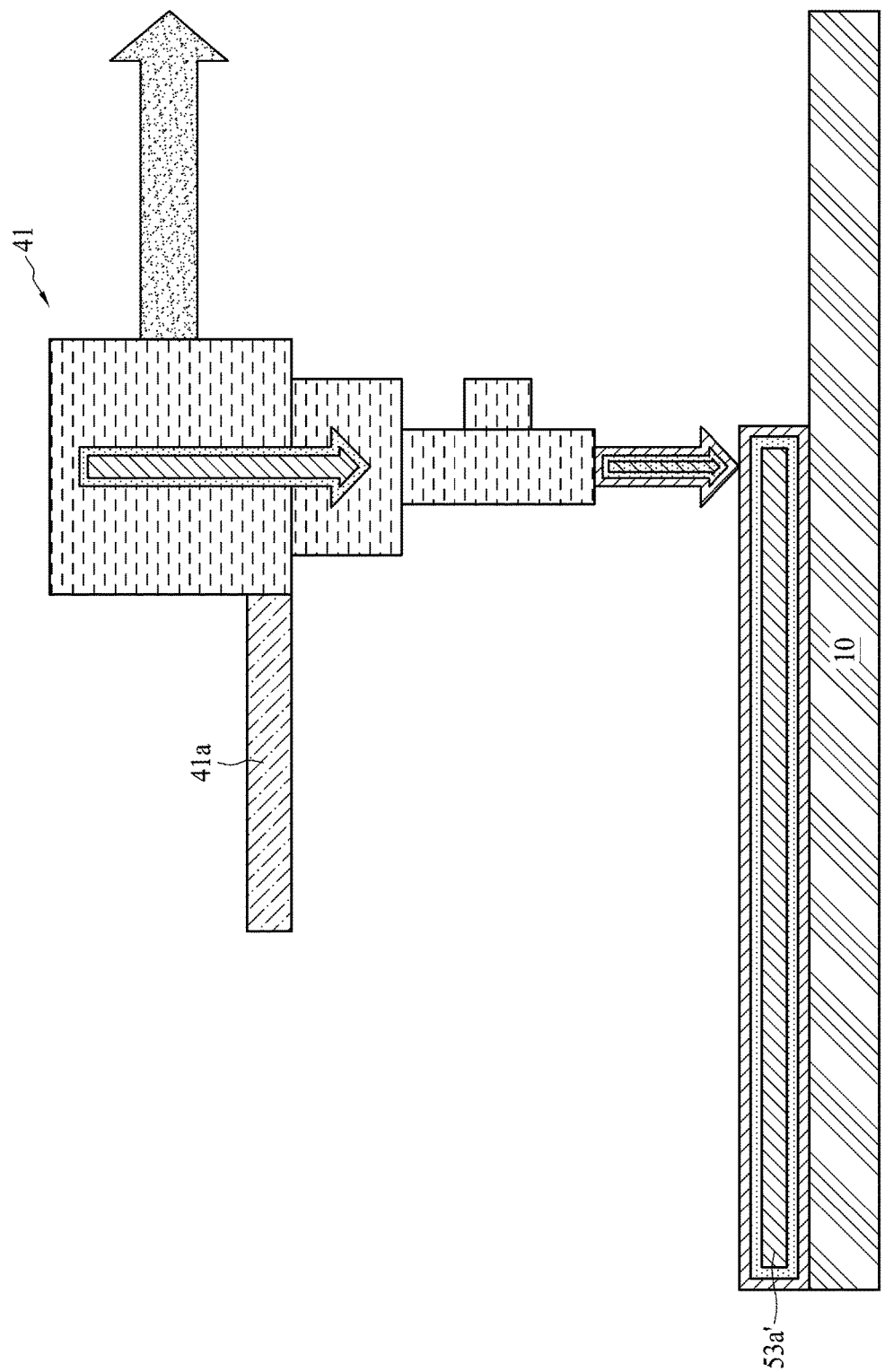
FIG. 5D illustrates a process for manufacturing a shielding wall in accordance with some embodiments of the present disclosure.

FIG. 5D illustrates a process for manufacturing the shielding wall 53 in accordance with some embodiments of the present disclosure. In some embodiments, the operation shown in FIG. 5D can be carried out before the formation of a package body 12 on a substrate 10. As shown in FIG. 5D, a nozzle 41 is moved horizontally over a substrate 10 and configured to dispense or apply a conductive material 53a' on the top surface of the substrate 10 to form the conductive member 53. In some embodiments, the nozzle 41 may include a curing apparatus 41a configured to radiate UV light to cure the conductive material 53a' on the top surface of the substrate 10. After the first level of the conductive member 53a is formed at a predetermined location on the top surface of the substrate 10, the nozzle 41 repeats the operation to form multiple levels of conductive member on the first level of the conductive member 53a until the stacked conductive members reaches a predetermined height to form the shielding wall 53.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising
   a substrate having a top surface;
   a shielding wall disposed on the top surface, the shielding wall comprising a conductive main body and a plurality of protruding portions extending from the conductive main body in a direction substantially parallel to the top surface of the substrate;
   a package body encapsulating the shielding wall; and
   at least two electronic components disposed on the substrate,
   wherein at least one of the protruding portions is disposed between the at least two electronic components and separates the at least two electronic components.

2. The semiconductor package device of claim 1, wherein the protruding portions are separated from each other.

3. The semiconductor package device of claim 1, wherein at least one of the protruding portions has a curved surface.

4. The semiconductor package device of claim 1, wherein the conductive main body defines at least a portion of a through hole.

5. The semiconductor package device of claim 1, wherein at least one of the protruding portions defines at least a portion of a through hole.

6. The semiconductor package device of claim 1, wherein the package body has a first lateral surface and a second lateral surface, and the shielding wall extends from the first lateral surface of the package body to the second lateral surface of the package body.

7. The semiconductor package device of claim 6, wherein there is a gap between the first lateral surface and the shielding wall.

8. The semiconductor package device of claim 1, further comprising a ground pad disposed on the top surface of the substrate and electrically connected to the shielding wall.

9. The semiconductor package device of claim 1, further comprising a conductive layer disposed on the package body and the shielding wall.

10. A semiconductor package device, comprising:
    a substrate having an upper surface;
    a shielding wall disposed on the upper surface of the substrate, the shielding wall having an upper surface and defining a plurality of through holes to expose the upper surface of the substrate;
    a package body encapsulating the shielding wall; and
    at least two electronic components disposed on the substrate,
    wherein at least one of the through holes is between the at least two electronic components and separates the at least two electronic components.

11. The semiconductor package device of claim 10, wherein the shielding wall comprises a plurality of protruding portions surrounding the through holes.

12. The semiconductor package device of claim 10, wherein a depth of each of the through holes is substantially the same as a height of the shielding wall.

13. The semiconductor package device of claim 10, wherein the upper surface of the shielding wall is exposed from the package body.

14. A semiconductor package device, comprising
    a substrate having a top surface;
    a package body disposed on the top surface of the substrate;
    a conductive main body disposed on the top surface of the substrate and encapsulated by the package body, the conductive main body including a first set of conductive columns; and
    at least two electronic components disposed on the substrate,
    wherein at least one conductive column of the first set of conductive columns is disposed between the at least two electronic components and separates the at least two electronic components; and
    wherein a projected area of one conductive column of the first set of conductive columns on the top surface of the substrate is greater than an area of the one conductive column of the first set of conductive columns that is exposed from the package body.

15. The semiconductor package device of claim 14, wherein the conductive main body further comprises a second set of conductive columns, and the second set of conductive columns and the first set of conductive columns are interlaced.

16. The semiconductor package device of claim 15, wherein the first set of conductive columns is arranged in a first direction and the second set of conductive columns is arranged in a second direction that is different from the first direction.

17. The semiconductor package device of claim 16, wherein the first set of conductive columns intersects the second set of conductive columns.

18. The semiconductor package device of claim 17, wherein the first set of conductive columns and the second set of conductive columns extend from a top surface of the package body to the top surface of the substrate.

19. The semiconductor package device of claim 16, wherein the first set of conductive columns and the second set of conductive columns are disposed in different rows, and one or more conductive columns of the first set of conductive columns contacts the second set of conductive columns.

20. The semiconductor package device of claim 19, wherein the first set of the conductive columns and the second set of the conductive columns extend from a top surface of the package body to the top surface of the substrate.

21. The semiconductor package device of claim 14, wherein each of the first set of conductive columns is substantially cylinder-shaped.

22. The semiconductor package device of claim 14, wherein an angle between an extending direction of the first set of conductive columns and a direction normal to a top surface of the package body is greater than 0 degrees and less than or equal to about 45 degrees.

23. The semiconductor package device of claim 14, wherein a ratio of a width of each conductive column of the first set of conductive columns to a pitch of the first set of conductive columns is greater than or equal to about 0.5 and less than about 1.

24. The semiconductor package device of claim 14, further comprising a ground pad disposed on the top surface of the substrate and electrically connected to the conductive main body.

25. The semiconductor package device of claim 14, further comprising a conductive layer disposed on the package body and the conductive main body.

26. A semiconductor package device, comprising
  a substrate;
  a shielding wall disposed on the substrate, the shielding wall comprising a plurality of conductive members disposed adjacent to each other, wherein at least one of the conductive members comprises a core, an inner layer covering the core and an outer layer covering the inner layer;
  a package body disposed on the substrate and covering the shielding wall, the package body comprising a first portion and a second portion separated from the first portion by the shielding wall; and
  at least two electronic components disposed on the substrate,
  wherein the at least one of the conductive members is disposed between the at least two electronic components and separates the at least two electronic components.

27. The semiconductor package device of claim 26, wherein a dielectric constant of the inner layer is greater than a dielectric constant of the core, and a dielectric constant of the outer layer is greater than the dielectric constant of the inner layer.

28. The semiconductor package device of claim 26, wherein thicknesses of the core, the inner layer and the outer layer are different from each other.

29. The semiconductor package device of claim 28, wherein the thickness of the outer layer is greater than the thickness of the inner layer and the thickness of the inner layer is greater than the thickness of the core.

30. The semiconductor package device of claim 26, wherein a boundary between two adjacent conductive members is substantially perpendicular to a top surface of the substrate.

31. The semiconductor package device of claim 30, further comprising a conductive material between the two adjacent conductive members.

32. The semiconductor package device of claim 26, wherein a boundary between two adjacent conductive members is substantially parallel to a top surface of the substrate.

33. The semiconductor package device of claim 26, wherein the package body has a first lateral surface and a second lateral surface, and the shielding wall extends from the first lateral surface to the second lateral surface.

34. The semiconductor package device of claim 26, wherein a portion of the package body is disposed between two adjacent conductive members.

35. The semiconductor package device of claim 34, further comprising a conductive material disposed between the two adjacent conductive members.

36. The semiconductor package device of claim 35, wherein the conductive material includes a core and an encapsulant covering the core.

37. The semiconductor package device of claim 26, wherein the shielding wall extends from a lateral surface of the package body to a surface of the package body adjacent to, or opposite to, the lateral surface of the package body.

* * * * *